(12) United States Patent
Suzuki et al.

(10) Patent No.: US 8,288,865 B2
(45) Date of Patent: Oct. 16, 2012

(54) SEMICONDUCTOR MODULE HAVING SEMICONDUCTOR DEVICE MOUNTED ON DEVICE MOUNTING SUBSTRATE

(75) Inventors: Atsunobu Suzuki, Osaka (JP); Koichi Saito, Osaka (JP); Yasuyuki Yanase, Osaka (JP); Takahiro Fujii, Osaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 136 days.

(21) Appl. No.: 12/696,410

(22) Filed: Jan. 29, 2010

(65) Prior Publication Data
US 2010/0193946 A1 Aug. 5, 2010

(30) Foreign Application Priority Data
Jan. 30, 2009 (JP) .................................. 2009-020968

(51) Int. Cl.
*H01L 23/48* (2006.01)
(52) U.S. Cl. ........ 257/737; 257/738; 257/780; 257/787; 257/E23.141; 257/788; 257/E21.001
(58) Field of Classification Search .......... 257/737–738, 257/787
See application file for complete search history.

(56) References Cited

U.S. PATENT DOCUMENTS
2006/0292742 A1* 12/2006 Nagasaki ...................... 438/106

FOREIGN PATENT DOCUMENTS
JP 2005-252169 A 9/2005
JP 2006-147810 6/2006

OTHER PUBLICATIONS

Japanese Notification of Reason(s) for Refusal, w/ English translation thereof, issued in Japanese Patent Application No. JP 2009-020968 dated Aug. 7, 2012.

* cited by examiner

*Primary Examiner* — Thanh Nguyen
(74) *Attorney, Agent, or Firm* — McDermott Will & Emery LLP

(57) ABSTRACT

A semiconductor module includes: an insulating resin layer; a wiring layer which is provided on one main surface of the insulating resin layer and which includes an external connection region; bump electrodes which are electrically connected to the wiring layer and each of which is formed such that it protrudes from the wiring layer toward the insulating resin layer; a semiconductor device which is provided on the other main surface of the insulating resin layer and which includes device electrodes connected to the bump electrode; and a wiring protection layer provided on the wiring layer and the insulating resin layer so as to expose the external connection region. In the semiconductor module, the outer edge portion of the wiring protection layer is in contact with the external edge portion of the semiconductor device such that it shields at least a part of the semiconductor resin layer at the side edge.

5 Claims, 12 Drawing Sheets

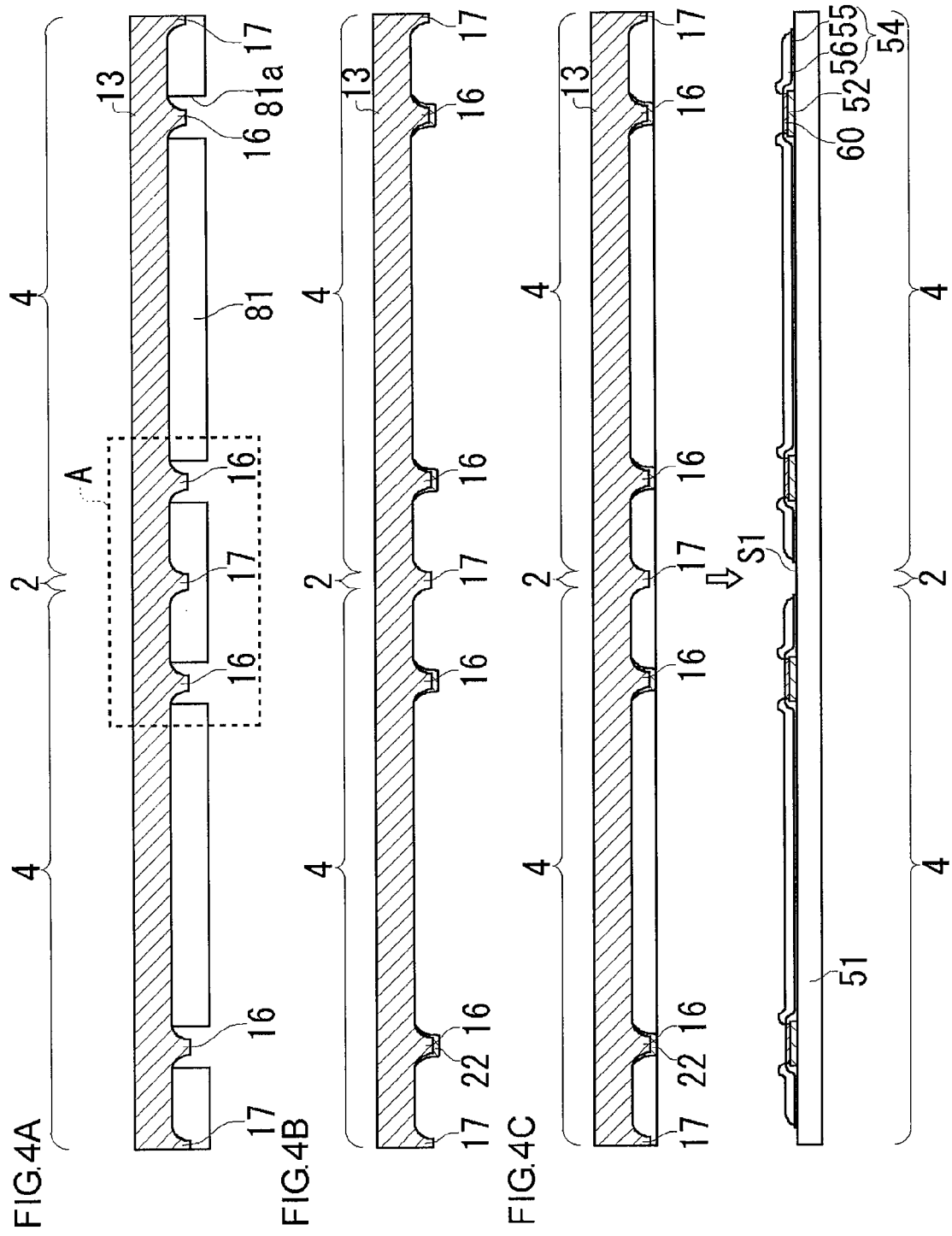

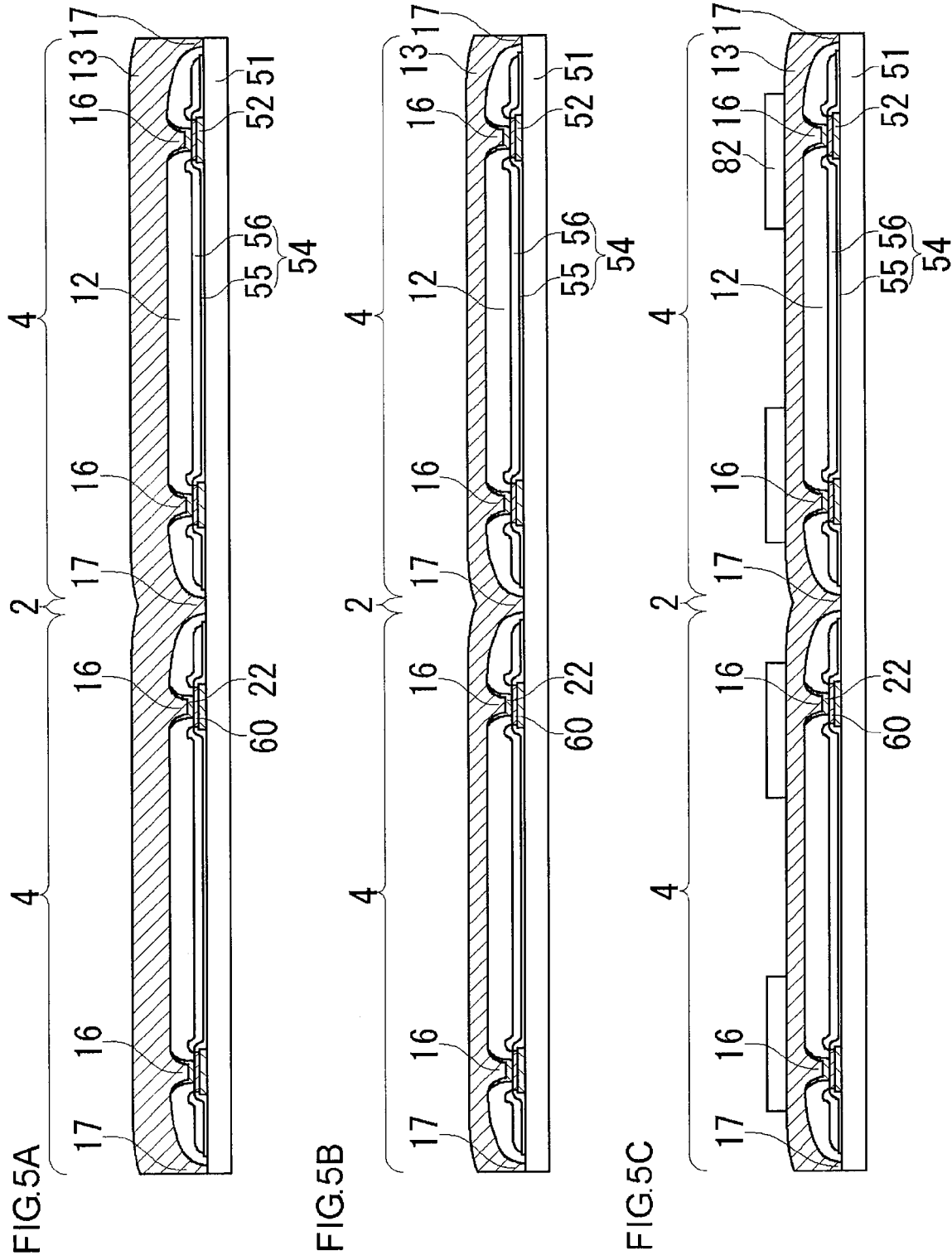

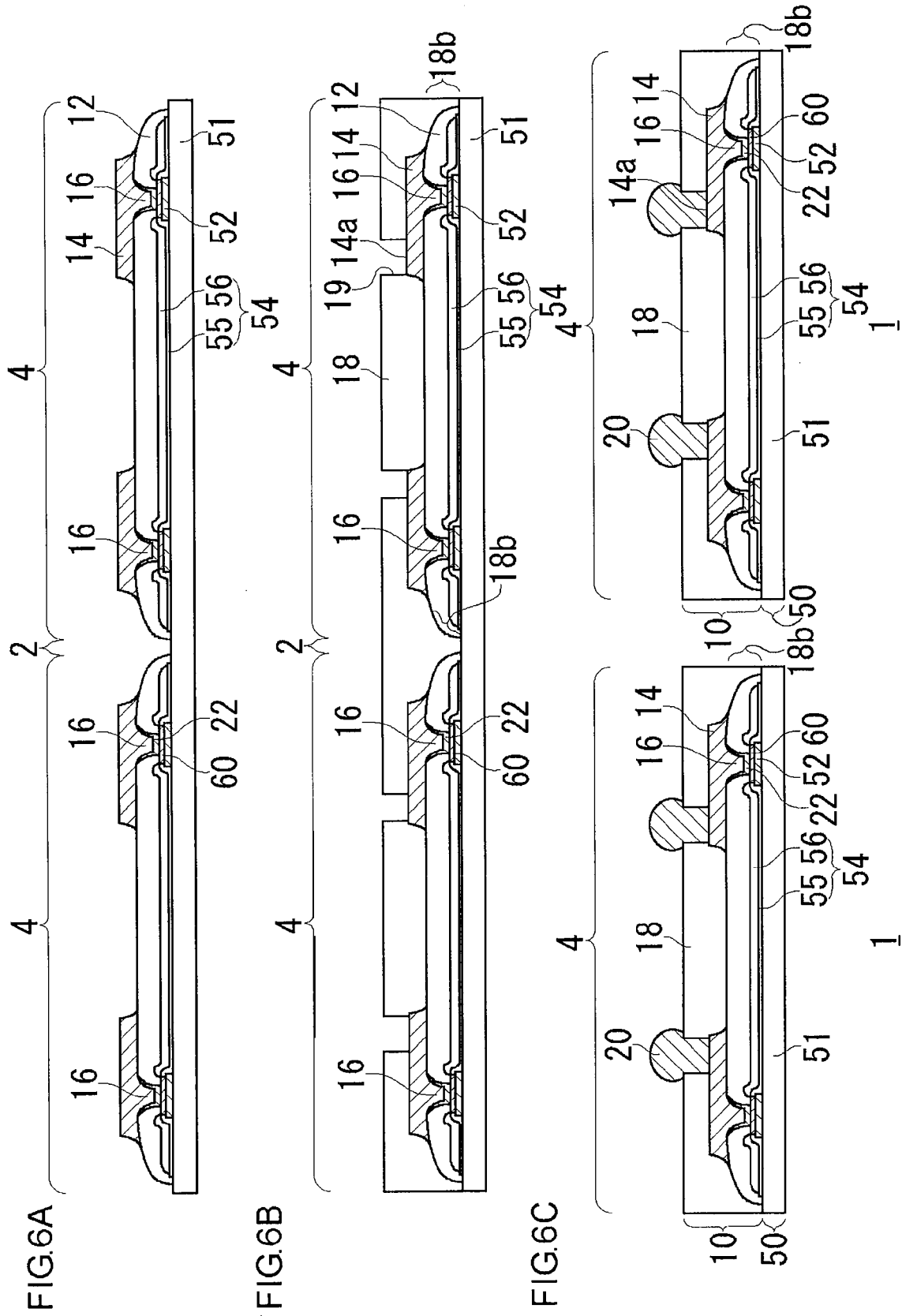

SEMICONDUCTOR MODULE HAVING SEMICONDUCTOR DEVICE MOUNTED ON DEVICE MOUNTING SUBSTRATE

BACKGROUND OF THE INVENTION

This application is based upon and claims the benefit of priority from the prior Japanese Patent Applications No. 2009-020968, filed Jan. 30, 2009, the entire contents of which are incorporated herein by reference.

FIELD OF THE INVENTION

The present invention relates to a semiconductor module, a manufacturing method for the semiconductor module, and a mobile device.

DESCRIPTION OF THE RELATED ART

As a surface mounting method for semiconductor devices, flip-chip mounting methods are known in which a solder bump is formed on each electrode of a semiconductor device, and the solder bumps thus formed are connected to corresponding electrode pads formed on a printed-wiring substrate. Also, as a structure formed using such a flip-chip mounting method, the CSP (Chip Size Package) structure is known, for example.

Also, in recent years, improvement of the functions of miniaturized electronic devices has involved an increased demand for providing further miniaturized semiconductor devices. With such miniaturized semiconductor devices, a technique is required for forming electrodes at a narrower pitch for mounting each semiconductor device on a printed-wired substrate. However, in the flip-chip mounting method, formation of the electrodes at an even narrower pitch is limited by the size of each solder bump itself, bridge formation that occurs in the solder bonding process, etc.

As a structure for overcoming such limitations, a semiconductor module is known having a structure in which protrusion members are formed on the wiring, each protrusion member is used as an electrode or as a via, and each protrusion member thus formed is connected to a corresponding device electrode of a semiconductor device, with an insulating resin such as epoxy resin, polyimide resin, or the like introduced between the wiring and the semiconductor device.

Conventional semiconductor modules have a structure in which an insulating resin is exposed on the surfaces of the sides of each end. Such conventional semiconductor modules have a problem in which, in some cases, moisture in the atmosphere infiltrates into the semiconductor module through such an insulating resin due to the relatively high hygroscopicity of epoxy rein or polyimide resin. Also, with such conventional semiconductor modules, such moisture could infiltrate into the semiconductor module through an interface between the insulating resin and a wiring protection layer laminated onto a wiring layer or through an interface between the insulating resin and a device protection layer laminated onto the semiconductor device. In some cases, infiltration of moisture into the semiconductor module leads to corrosion of metal members such as the wiring, device electrodes, etc., after the moisture infiltrates. Furthermore, such an arrangement has a problem in which, in a case in which moisture in the atmosphere infiltrates into an interface between the insulating resin and the wiring protection layer or the device protection layer, in some cases, the insulating resin layer, the wiring protection layer, and the device protection layer separate due to moisture vaporization caused by the heat applied in the manufacturing process for the semiconductor module. Such corrosion of metal members, and separation of the insulating resin layer, the wiring protection layer, and the device protection layer, lead to a problem of reduced reliability in the connections between each protrusion member and the corresponding device electrode.

SUMMARY OF THE INVENTION

It is a general purpose of the present invention to provide a technique for improving reliability in connection between each bump electrode (protrusion electrode) and the corresponding device electrode in a structure in which the bump electrodes provided to a wiring layer are connected to the device electrodes provided to a semiconductor device.

An embodiment of the present invention relates to a semiconductor module. The semiconductor module comprises: an insulating resin layer; a wiring layer provided on one main surface of the insulating resin layer, and including an external connection region; bump electrodes which are electrically connected to the wiring layer, and each of which is formed so as to protrude from the wiring layer toward the insulating resin layer side; a semiconductor device which is provided on the other main surface of the insulating resin layer, and which includes device electrodes connected to the bump electrodes; and a wiring protection layer provided on the wiring layer and the insulating resin layer such that the external connection region is exposed. With such an embodiment, an outer edge portion of the wiring protection layer is in contact with an outer edge portion of the semiconductor device such that at least a part of the insulating resin layer is shielded at a side edge.

With the above-described embodiment, the semiconductor device may comprise a device protection layer arranged such that each of the device electrodes is exposed. Also, an outer edge portion of the insulating resin layer may be in contact with the semiconductor device on the inner side of a region where the outer edge portion of the wiring protection layer and the outer edge portion of the semiconductor device are in contact, such that at least a part of the outer edge of the device protection layer is shielded.

With the above-described embodiment, a rough surface structure may be provided on the face of the wiring protection layer that is in contact with the insulating resin layer in the vicinity of the outer edge portion of the wiring protection layer.

With the above-described embodiment, the outer edge portion of the wiring protection layer and the outer edge portion of the semiconductor device may be in contact over the entire outer edge of the semiconductor device as seen from a planar view.

With the above-described embodiment, the semiconductor device may have a polygonal shape as seen from a planar view. Also, the outer edge portion of the wiring protection layer and the outer edge portion of the semiconductor device may be in contact at each corner of the semiconductor device.

With the above-described embodiment, the surface of the outer edge portion of the insulating resin layer that is in contact with the wiring protection layer may have a curved shape as seen in cross-section.

Another embodiment of the present invention relates to a mobile device. The mobile device mounts a semiconductor module according to any one of the above-described embodiments.

Yet another embodiment of the present invention relates to a manufacturing method for a semiconductor module. The manufacturing method for a semiconductor module comprises: preparing a metal plate having one main surface on which bump electrodes are provided, and on which dummy bumps having a top face with a greater width than that of a dicing line are provided in a region that corresponds to scribe lines; preparing a semiconductor substrate on which multiple semiconductor devices having device electrodes have been severally provided to multiple regions partitioned by the scribe lines, and a device protection layer is provided such that the device electrodes are exposed; pressure-bonding the metal plate and the semiconductor substrate in a state in which an insulating resin layer is introduced between the metal plate and the semiconductor substrate so as to electrically connect each of the bump electrodes to the corresponding device electrode, and so as to press each of the dummy bumps into contact with the semiconductor substrate on the outer side of the outer edge portion of the device protection layer; selectively removing the metal plate so as to form a wiring layer including an external connection region, and so as to remove the dummy bumps; providing a wiring protection layer on the wiring layer and the insulating resin layer such that the external connection region is exposed, and so as to fill in regions where the dummy bumps have been removed, thereby forming multiple semiconductor modules coupled to one another; and cutting the semiconductor substrate and the metal plate along the scribe lines so as to separate the semiconductor modules from one another.

With the above-described embodiment, the manufacturing method for a semiconductor module may further comprise formation of a rough surface structure on the side face of the dummy bump.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 4A through 4C are cross-sectional manufacturing step diagrams which show a manufacturing method for the semiconductor module according to the embodiment 1;

FIGS. 5A through 5C are cross-sectional manufacturing step diagrams which show a manufacturing method for the semiconductor module according to the embodiment 1;

FIGS. 6A through 6C are cross-sectional manufacturing step diagrams which show a manufacturing method for the semiconductor module according to the embodiment 1;

DETAILED DESCRIPTION OF THE INVENTION

Figure 1:
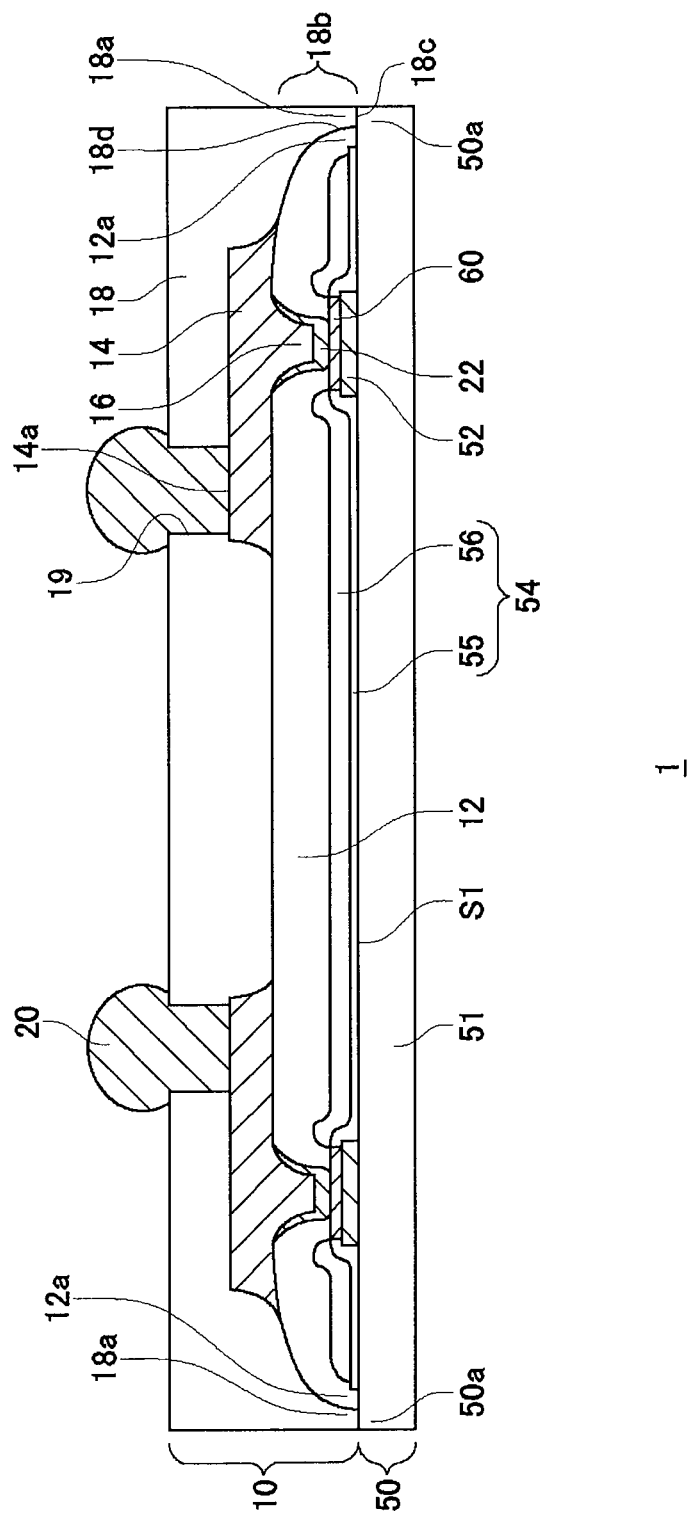
FIG. 1 is a schematic cross-sectional diagram which shows a structure of a semiconductor module according to an embodiment 1.

The invention will now be described by reference to the preferred embodiments. This does not intend to limit the scope of the present invention, but to exemplify the invention.

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

Embodiment 1

Figure 2:
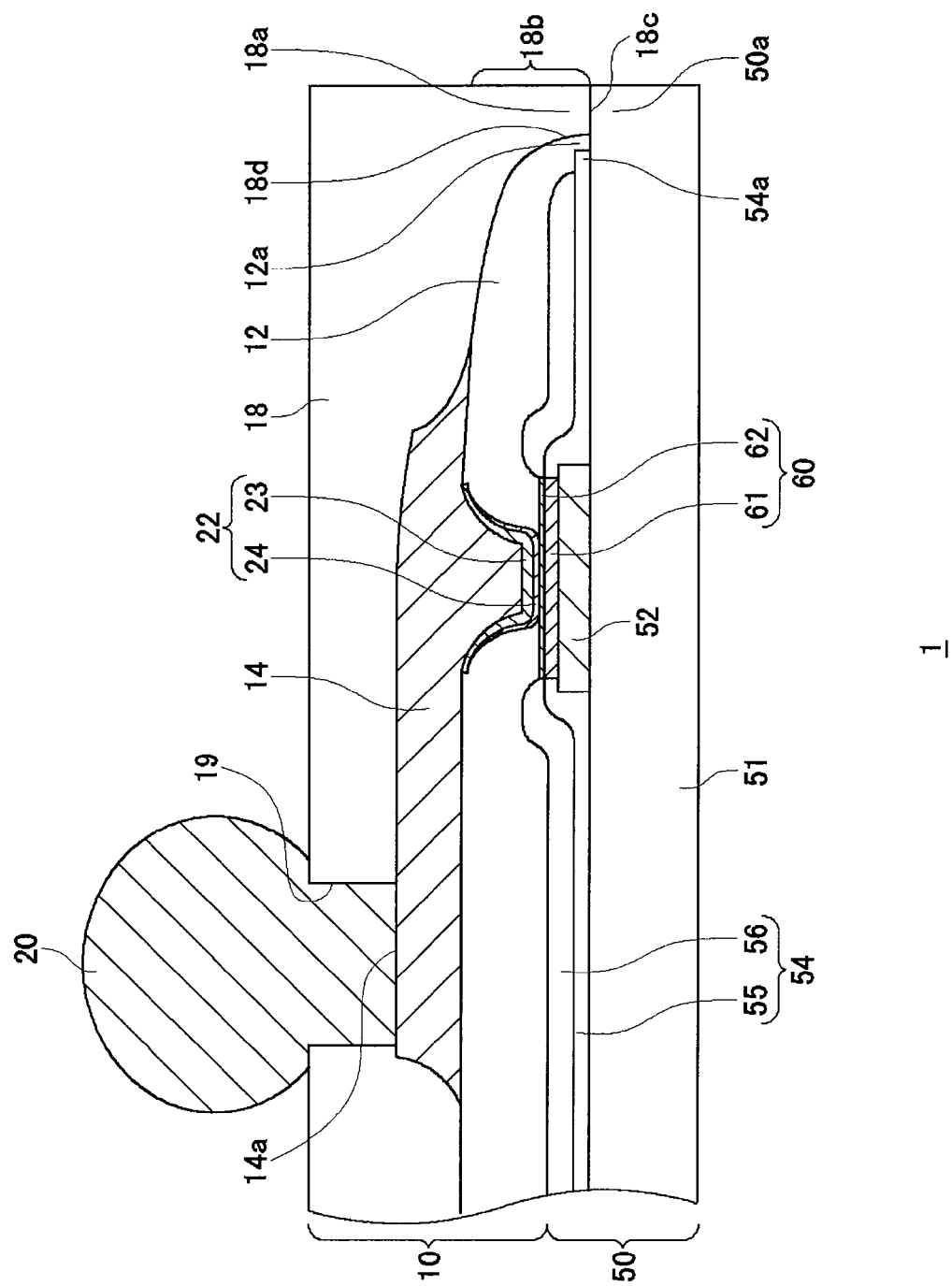
FIG. 2 is a schematic cross-sectional diagram of an enlarged portion, including the region of the end of the semiconductor module shown in FIG. 1.

Description will be made with reference to FIGS. 1 and 2 regarding a structure of a semiconductor module according to an embodiment 1. FIG. 1 is a schematic cross-sectional diagram which shows the structure of the semiconductor module according to the embodiment 1. FIG. 2 is a schematic cross-sectional diagram of an enlarged portion, including the region of the end of the semiconductor module shown in FIG. 1.

The semiconductor module 1 includes a device mounting substrate 10 and a semiconductor device 50.

The semiconductor device 50 includes a semiconductor substrate 51, device electrodes 52, and a device protection layer 54.

The semiconductor substrate 51 is a P-type silicon wafer, for example. An integrated circuit (IC) or a large-scale integrated circuit (LSI) (not shown) is formed on a main surface S1 side (the upper face side shown in FIG. 1) of the semiconductor substrate 51 using known techniques.

The device electrodes 52 are provided on the main surface S1 to be used as a mounting surface such that they are connected to the integrated circuit. As a material for the device electrodes 52, metal such as aluminum (Al), copper (Cu), or the like, is employed. A metal layer 60 is laminated onto the surface of each device electrode 52. The metal layer 60 includes a Ni layer 60 formed of nickel (Ni) in contact with the corresponding device electrode 52 and a Au layer 62 formed of gold (Au) laminated onto the Ni layer 61. That is to say, the metal layer 60 is provided in the form of a Ni/Au layer structure (not shown in FIG. 1).

The device protection layer 54 is provided over the main surface S1 of the semiconductor device 50 such that each device electrode 52 (metal layer 60) is exposed. As the device protection layer 54, a silicon oxide film (SiO2), a silicon nitride film (SiN), polyimide (PI) film, or the like is suitably employed. The device protection layer 54 according to the present embodiment has a structure including a silicon nitride film 55 in contact with the semiconductor substrate 51 and a polyimide film 56 laminated onto the silicon nitride film 55.

The device mounting substrate 10 includes an insulating resin layer 12, a wiring layer 14 (re-wiring), and bump electrodes 16 which are electrically connected to the wiring layer 14 and which protrude from the wiring layer 14 toward the insulating resin layer 12 side.

The insulating resin layer 12 is formed of an insulating resin, and functions as an adhesion layer between the wiring layer 14 and the semiconductor device 50. Examples of material employed as the insulating resin layer 12 include: an insulating material, in which plasticity is induced by applying pressure; an insulating material, in which plasticity is induced by applying heat; an insulating material, the shape of which can be changed by applying heat, etc. The thickness of the insulating resin layer 12 is approximately 20 μm, for example.

Examples of insulating materials in which plasticity is induced by applying pressure include a thermosetting epoxy resin. The thermosetting epoxy resin employed for the insulating resin layer 12 should have a viscosity of approximately 1 kPa·s at a temperature of approximately 160° C. and at a pressure of approximately 8 Mpa, for example. Furthermore, when approximately 5 to 15 Mpa pressure is applied to such a thermosetting epoxy resin at a temperature of approximately 160° C., the thermosetting epoxy resin exhibits reduced viscosity, to approximately ⅛ the viscosity when no pressure is applied. In comparison, the epoxy resin in the B-stage, at a temperature equal to or smaller than the glass-transition temperature before the heat-setting, has a small viscosity approximately the same as that when no pressure is applied. In this case, applying pressure does not lead to an increase in viscosity. Furthermore, the thermosetting epoxy resin is a dielectric material having a dielectric constant of approximately 3 to 4.

Examples of insulating materials in which plasticity is induced by applying heat include thermoplastic resin such as thermoplastic acrylic resin, etc. The temperature at which plasticity is induced in thermoplastic resin is approximately 150 to 200° C., for example.

As a material which changes shape when heat is applied, a thermosetting resin having a glass-transition temperature (Tg) of approximately 80 to 130° C. may be employed. Examples of such thermosetting resin include thermosetting polyimide resin, etc.

Also, the insulating resin layer 12 may be formed of a thermosetting resin, examples of which include: melamine derivative such as BT resin etc., thermosetting resin such as liquid crystal polymer, PPE resin, fluorine resin, phenolic resin, polyamide bismaleimide, etc.

The wiring layer 14 is provided on the main surface of the insulating resin layer 12, which is the opposite side of the semiconductor device 50 side. The wiring layer 14 is formed of an electro-conductive material, is preferably formed of rolled metal, and is more preferably formed of rolled copper. Rolled copper is a superior material for the re-wiring process in terms of mechanical strength as compared with a metal film formed of copper using an electroplating process or the like. It should be noted that the wiring layer 14 may be formed of electrolyte copper or the like. The wiring layer 14 includes: an electrode formation region where bump electrodes 16 are formed, a wiring region that extends continuously from the electrode formation region; and an external connection region 14a (land region) provided as a terminal of the wiring region, which is arranged on the opposite side of the electrode formation region. Each solder ball 20 described later is arranged on the external connection region 14a. The thickness of the wiring layer 14 is approximately 15 μm, for example.

Each bump electrode 16 is formed in the electrode formation region of the wiring layer 14 such that they protrude from and pass through the insulating resin layer 12, whereby they reach the semiconductor device 50. Each electrode formation region (bump electrode 16) is formed at a position that corresponds to a corresponding device electrode 52 of the semiconductor device 50, thereby connecting each bump electrode 16 to the corresponding device electrode 52. In the present embodiment, each bump electrode 16 is monolithically formed with the wiring layer 14. This ensures connection between the wiring layer 14 and each bump electrode 16. Furthermore, such a bump electrode 16 monolithically formed with the wiring layer 14 prevents cracking, etc., from occurring at an interface between the wiring layer 14 and the bump electrode 16 due to thermal stress that can occur in the usage environment. Furthermore, such an arrangement allows each device electrode 52 to be electrically connected to the wiring layer 14 at the same time as the pressure bonding between each bump electrode 16 and the corresponding device electrode 52. This provides the advantage of a reduced number of manufacturing steps.

Each bump electrode 16 that protrudes from the wiring layer 14 toward the insulating resin layer 12 side has an overall structure having a cross-sectional diameter that becomes thinner as it approaches the tip. In the present embodiment, as seen from a planar view, the bump electrode 16 has an approximately circular shape, encompassing elliptical shapes. However, the present invention is not restricted to such a structure. For example, as seen from a planar view, the bump electrode 16 may have a polygonal shape such as a rectangular shape or the like. A metal layer 22 is laminated onto the top face and the side face of the bump electrode 16. The metal layer 22 includes: a Ni layer 23 formed of nickel (Ni) in contact with the bump electrode 16; and a Au layer 24 formed of gold (Au) laminated onto the Ni layer 23. That is to say, the metal layer 22 is provided in the form of a Ni/Au layer structure (not shown in FIG. 1).

The metal layer 22 is laminated onto each bump electrode 16. The metal layer 60 is laminated onto each device electrode 52. Furthermore, the Au layer 24 is laminated onto the top face of the metal layer 22, and the Au layer 62 is laminated onto the top face of the metal layer 60. Thus, each bump electrode 16 is electrically connected to a corresponding device electrode 52 by a gold-to-gold connection between the Au layer 24 and the Au layer 62. This improves the reliability of the connection between the bump electrode 16 and the device electrode 52. It should be noted that the bump electrode 16 and the device electrode 52 may be directly connected to each other. The bump electrode 16 is formed with a height of approximately 20 μm, a top face diameter of approximately 45 μm, and a bottom face diameter of approximately 60 μm, for example. Furthermore, the Ni layers 23 and 61, and the Au layers 24 and 62 are formed with a thickness of approximately 1 to 15 μm, and with a thickness of approximately 0.03 to 1 μm, respectively, for example.

A wiring protection layer 18 is provided as an upper layer (shown in the top part of FIG. 1) for the wiring layer 14 and the insulating resin layer 12 in order to protect the wiring layer from oxidation, etc. Examples of the wiring protection layer 18 include a photo-solder resist layer (PSR), etc. An opening 19 is formed in a predetermined region of the wiring protection layer 18. Such an opening 19 exposes the corresponding external connection region 14a of the wiring layer 14. A solder ball 20, which functions as an external connector electrode, is formed within each opening 19. The solder ball 20 is electrically connected to the wiring layer 14. The position at which each solder ball 20 is formed, i.e., the region where each opening 19 is formed, corresponds to a terminal drawn out by re-wiring, for example. The thickness of the wiring protection layer 18 is approximately 25 μm.

Next, detailed description will be made with reference to FIG. 2 regarding the structure of the semiconductor module 1 in the edge region.

The semiconductor module 1 has a structure in which an outer edge portion 18a of the wiring protection layer 18 is formed in contact with an outer edge portion 50a of the semiconductor device 50 such that at least a part of the insulating resin layer 12 is shielded on the side edge face. That is to say, a protrusion portion 18b is provided to the side edge portion of the wiring protection layer 18 such that it protrudes toward the semiconductor device 50. With such a structure, the top face 18c of the protrusion portion 18b is in contact with the surface of the semiconductor device 50 (semiconductor substrate 51). This provides a state in which an outer edge portion 12a of the insulating resin layer 12 is coated with the wiring protection layer 18. In this state, the insulating resin layer 12 and the device protection layer 54 are not exposed, and only the semiconductor device 50 and the wiring protection layer 18 are exposed.

Furthermore, the outer edge portion 12a of the insulating resin layer 12 is in contact with the semiconductor 50 on the inner side of the region where the outer edge portion 18a of the wiring protection layer 18 is in contact with the outer edge portion 50a of the semiconductor device 50, and coats at least a part of an outer edge portion 54a of the device protection layer 54. That is to say, the outer edge portion 12a of the insulating resin layer 12 is arranged as an outer layer of the outer edge portion 54a of the device protection layer 54. With such a structure, the outer edge portion 12a arranged on the outer side of the outer edge portion 54a is formed along a side face 18d of the protrusion portion 18b such that it extends to and reaches the surface of the semiconductor device 50 (semiconductor substrate 51). Thus, the outer edge portion 54a is coated with the insulating resin layer 12.

As described above, the outer edge portion 54a is coated with the outer edge portion 12a being in contact with the semiconductor device 50. Thus, in the edge region of the semiconductor module 1, the insulating resin layer 12 is introduced between the device protection layer 54 and the wiring protection layer 18 in the horizontal direction (the left-to-right direction in FIG. 2). Furthermore, the surface along which the outer edge portion 12a comes into contact with the side face 18d of the protrusion portion 18b is curved, when seen in a longitudinal cross-section (the vertical direction in FIG. 2).

The wiring protection layer 18, the insulating resin layer 12, and the polyimide layer 56 exhibit heightening degrees of hygroscopicity, in this order. With the semiconductor module 1 according to the present embodiment, the insulating resin layer 12 and the device protection layer 54 are coated with the wiring protection layer 18, which has the lowest hygroscopicity. Thus, such an arrangement prevents moisture in the atmosphere from infiltrating into the semiconductor module 1. This prevents corrosion of metal members such as the wiring layer 14, the bump electrode 16, the device electrode 52, etc. Also, this protects against separation of the members such as the insulating resin layer 12, the wiring layer 14, the semiconductor device 50, etc. Furthermore, the device protection layer 54 is coated with the insulating resin layer 12, which has lower hygroscopicity than that of the polyimide film 56. Accordingly, the insulating resin layer 12 protects against the device protection layer 54 being contact with moisture even if moisture infiltrates through the wiring protection layer 18 or through the interface between the wiring protection layer 18 and the semiconductor device 50. Thus, such an arrangement further reduces the risk of corrosion of the metal members or the risk of separation of the aforementioned members.

A micro-rough surface structure may be provided to the surface of the wiring protection layer 18 that is in contact with the insulating resin layer 12 in the vicinity of the outer edge portion 18a, i.e., the side face 18d of the protrusion portion 18b. Accordingly, such a surface may have greater surface roughness than that of the top face 18c. The rough surface structure formed on the surface of the side face 18d provides a desired rough-surface anchor effect, thereby improving adhesion between the wiring protection layer 18 and the insulating resin layer 12. Such a desired anchor effect requires a rough surface structure formed on the side face 18d having a surface roughness Rmax of approximately 1.0 to 5.0 μm. In a case in which the surface roughness of the side face 18d has a surface roughness Rmax that is smaller than approximately 1.0 μm, it is difficult to provide a desired anchor effect. Moreover, in a case in which the surface roughness of the side face 18d has a surface roughness Rmax that is greater than approximately 5.0 μm, a cavity may be formed between the wiring protection layer 18 and the insulating resin layer 12. In some cases, such a cavity leads to separation of the wiring protection layer 18 and the insulating resin layer 12. Accordingly, although a rough surface structure having a surface roughness beyond the aforementioned range can be employed in the semiconductor module 1, the rough surface structure is preferably formed having a surface roughness within the aforementioned range. The surface roughness level that provides the desired anchor effect can be evaluated by experiment.

[Manufacturing Method for Semiconductor Module]

Figure 7A:
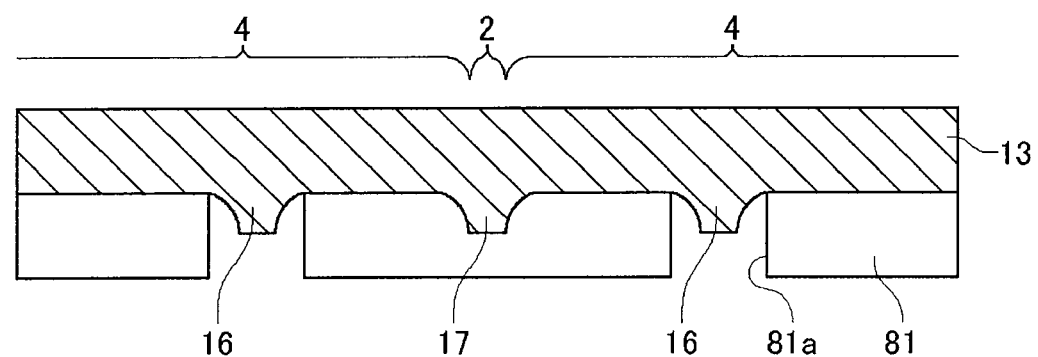
FIGS. 7A and 7B are cross-sectional manufacturing step diagrams which show a manufacturing method for the semiconductor module according to the embodiment 1.
Figure 7B:
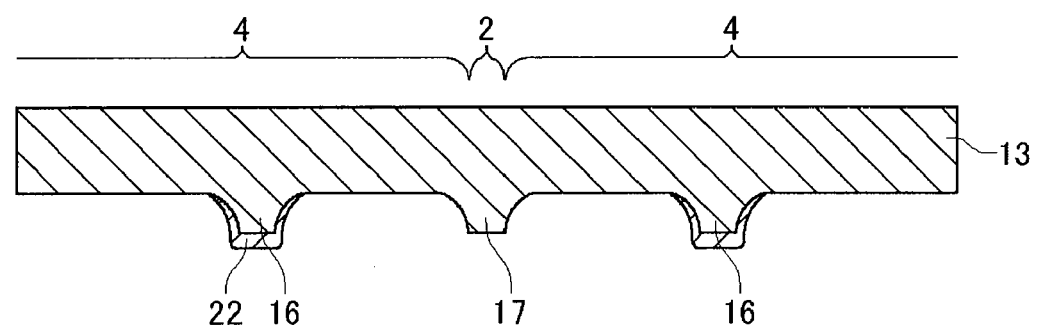
Figure 8A:
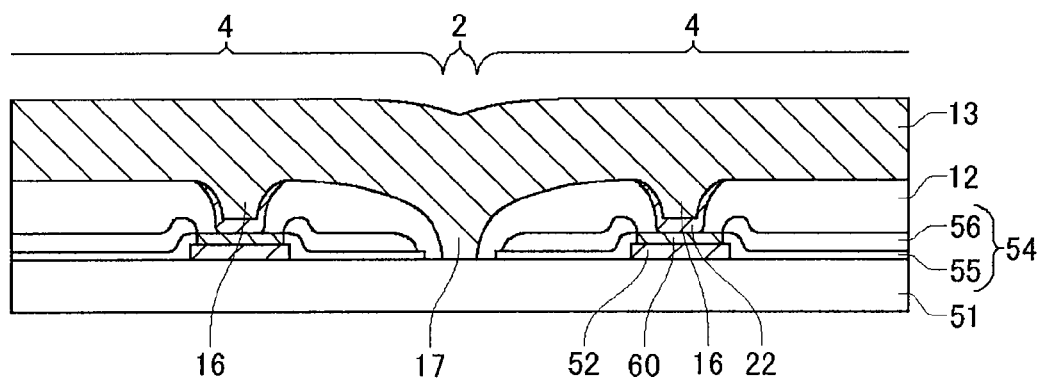
FIGS. 8A through 8C are cross-sectional manufacturing step diagrams which show a manufacturing method for the semiconductor module according to the embodiment 1.
Figure 8B:
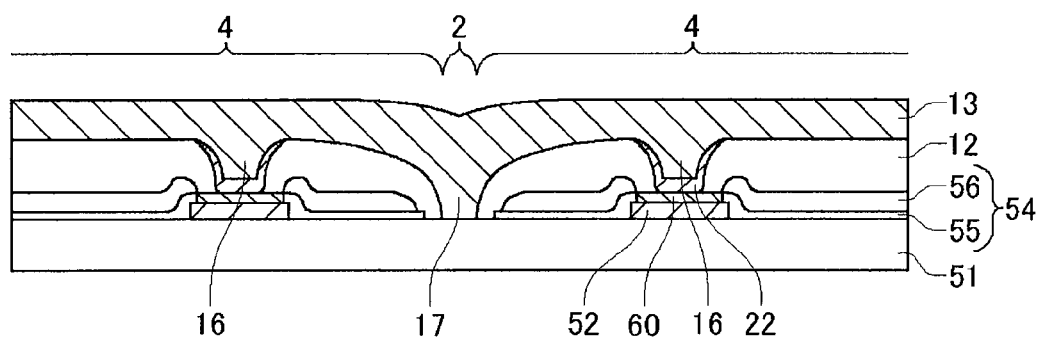
Figure 8C:
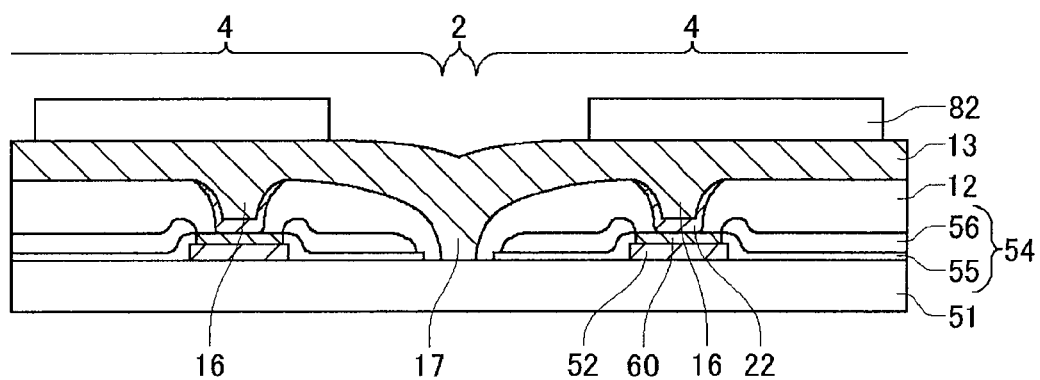
Figure 9A:
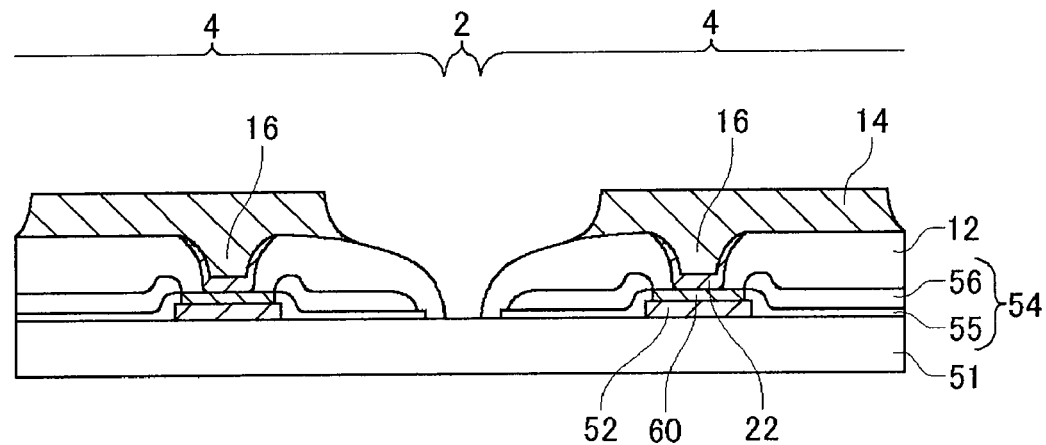
FIGS. 9A and 9B are cross-sectional manufacturing step diagrams which show a manufacturing method for the semiconductor module according to the embodiment 1.
Figure 9B:
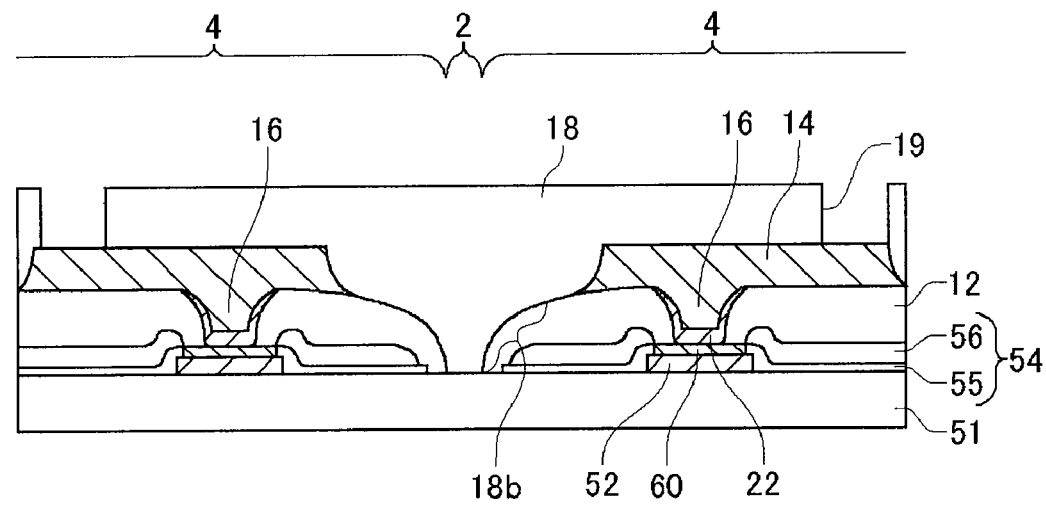

Description will be made with reference to FIGS. 3A through 9B regarding a manufacturing method for a semiconductor module according to the embodiment 1. FIGS. 3A through 9B are cross-sectional manufacturing step diagrams which show a manufacturing method for a semiconductor module according to the embodiment 1. FIGS. 3A through 3D show steps for forming the bump electrodes 16 and dummy bumps 17. FIGS. 4A through 9B show steps for connecting each bump electrode 16 to the corresponding device electrode 52, forming the wiring layer 14, lamination of the wiring protection layer 18, and dicing for separating the semiconductor modules 1 from one another. FIGS. 7A through 9B are schematic cross-sectional diagrams of an enlarged portion, which show a region A surrounded by a dotted line in FIG. 4A. FIGS. 7A and 7B correspond to FIGS. 4A and 4B, respectively. FIGS. 8A through 8C correspond to FIGS. 5A through 5C, respectively. FIGS. 9A and 9B correspond to FIGS. 6A and 6B, respectively.

Figure 3A:
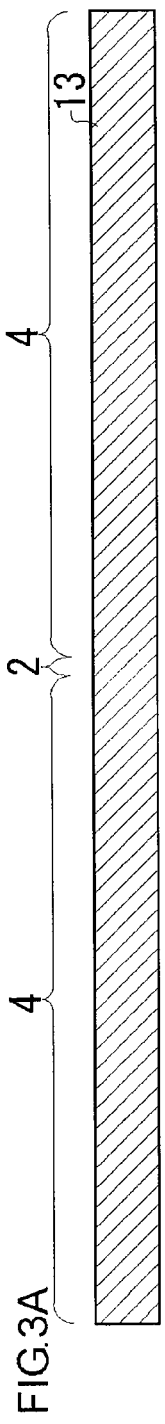
FIGS. 3A through 3D are cross-sectional manufacturing step diagrams which show a manufacturing method for the semiconductor module according to the embodiment 1.

First, as shown in FIG. 3A, a copper plate 13 is prepared as a metal plate having at least a thickness which is greater than the sum of the height of the bump electrode 16 shown in FIG. 1, the height of the dummy bump 17 described later, and the thickness of the wiring layer 14. As the copper plate 13, a rolled metal plate formed of rolled copper is employed.

Figure 3B:
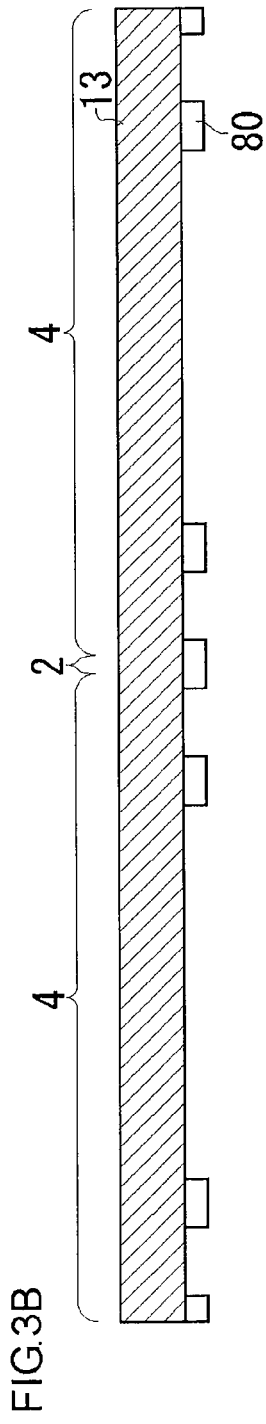

Next, as shown in FIG. 3B, using the photolithographic method, a resist pattern 80 is selectively formed on one main surface of the copper plate 13 such that it corresponds to the regions where the bump electrodes 16 and the protrusion portions 18b are to be formed. Here, each region where a bump electrode 16 is to be formed corresponds to a position at which a corresponding device electrode 52 (see FIG. 4C) is formed on the semiconductor substrate 51 partitioned into multiple semiconductor module formation regions 4 along multiple scribe lines 2. The scribe lines 2 are lines used to divide the semiconductor substrate 51 by scribing in a downstream step. Furthermore, the region where each protrusion portion 18b is to be formed corresponds to the position of the scribe line 2. Specifically, a resist film having a predetermined film thickness is applied to the copper plate 13 using a laminator apparatus. After the resist film thus applied is exposed using a photo mask having a pattern for forming the bump electrodes 16 and the protrusion portions 18b, the resist film thus exposed is developed, thereby selectively forming the resist pattern 80 on the copper plate 13. It should be noted that, in order to improve adhesion between the copper plate 13 and the resist pattern 80, preprocessing such as polishing, cleaning, etc. is preferably performed on the surface of the copper plate 13 as necessary before the resist film is laminated onto the copper plate 13.

Figure 3C:
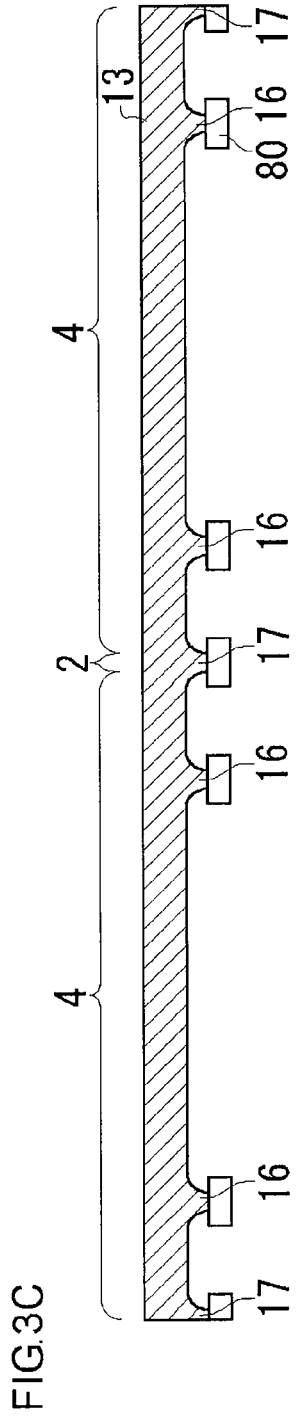

Next, as shown in FIG. 3C, wet etching processing is performed with the resist pattern 80 as a mask using an agent such as aqueous ferric chloride or the like, thereby forming the bump electrodes 16 and the dummy bumps 17, each of which has a predetermined circular truncated cone shape that protrudes from the surface of the copper plate 13. The bump electrodes 16 and the dummy bumps 17 thus formed each have a side face portion formed having a tapered shape with a diameter (size) that becomes thinner as it approaches the tip. Each dummy bump 17 is formed with a top face width that is smaller than the width of the scribe line 2, and is greater than the width of the dicing line. The width of the scribe line 2 is approximately 60 μm, for example. The width of the dicing line (the width of the blade used for dicing) is approximately 50 μm, for example. The height of the dummy bump 17, the diameter of its top face, and the diameter of its bottom face are approximately 20 μm, 55 μm, and 70 μm, respectively, for example. It should be noted that each bump electrode 16 and each dummy bump 17 are shown as having approximately the same size.

Figure 3D:
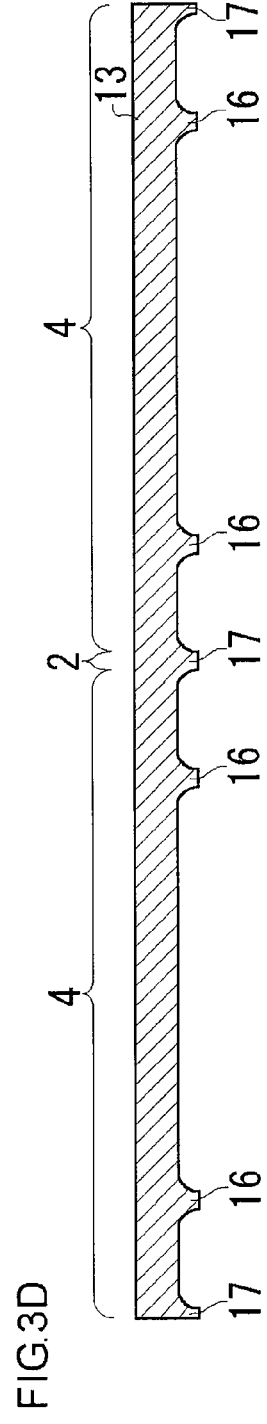

Next, as shown in FIG. 3D, the resist pattern 80 is removed using a remover. In the steps described above, the bump electrodes 16 and the dummy bumps 17 are monolithically formed on the copper plate 13. It should be noted that a metal mask such as a silver (Ag) mask may be employed, instead of the resist pattern 80. Such an arrangement ensures sufficient etching selectivity with respect to the copper plate 13, thereby providing even finer patterning of the bump electrodes 16.

Next, as shown in FIG. 4A and FIG. 7A, a resist film 81 having plating resistance is laminated onto the main surface of the copper plate 13 on the side where the bump electrodes 16 and the dummy bumps 17 have been formed, such that the bump electrodes 16 and the dummy bump 17 are embedded within the resist film 81. Next, by means of a lithographic method, openings 81a are formed so as to expose the bump electrodes 16. It should be noted that, in order to protect the copper plate 13, a resist protection film (not shown) is preferably formed over the whole surface of the copper plate 13 on the opposite side of the face to which the resist film 81 is applied (i.e., on the top side).

Next, as shown in FIGS. 4B and 7B, the metal layer 22 is formed on the top face and the side face of each bump electrode 16 exposed via the opening 81a, using an electrolytic plating method with the resist film 81 as a mask, for example. The metal layer 22 is provided in the form of a Ni/Au layer structure, for example. First, a Ni layer is formed on the top face and the side face of each bump electrode 16, following which a Au layer is formed on the Ni layer thus formed, thereby forming the metal layer 22. It should be noted that the metal layer 22 may be formed on only the top face of each bump electrode 16. In this case, each opening 81a is formed in the resist film 81 with an opening size that exposes only the top face of the bump electrode 16. After the metal layer 22 is formed, the resist film 81 is removed using a remover.

Next, as shown in FIG. 4C, a semiconductor substrate 51 (6-inch semiconductor wafer) is prepared on which the semiconductor module formation regions 4 having the device electrodes 52 and the device protection layer 54 have been formed on the main face S1 side. The multiple semiconductor module formation regions 4 are partitioned by the scribe lines 2. FIG. 4C shows two semiconductor devices. Specifically, a semiconductor manufacturing process, which is a combination of known lithography techniques, etching techniques, ion implantation techniques, film formation techniques, heat treatment techniques, and so forth, is performed for each semiconductor module formation region 4 within the semiconductor substrate 51 such as a P-type silicon substrate or the like, so as to form predetermined integrated circuits on the main surface S1, and to form the device electrodes 52 along the outer edge of each integrated circuit. Subsequently, the device protection layer 54 including the silicon nitride film 55 and the polyimide film 56 is formed on the main surface S1 of the semiconductor substrate 51, except for the region where the device electrodes 52 are formed. Furthermore, the metal layer 60 formed of a Ni layer and a Au layer is laminated onto each device electrode 52. The device protection layer 54 is not formed in the region that corresponds to the region where the dummy bump 17 is formed.

Furthermore, as shown in FIG. 4C, using a vacuum laminating method, for example, the insulating resin layer 12 is laminated onto the surface of the copper plate 13 on the side where the bump electrodes 16 and the dummy bumps 17 are formed. As described above, as the insulating resin layer 12, an insulating material is employed in which plasticity is induced or the shape of which changes when pressure or heat is applied. Subsequently, the film thickness of the insulating resin layer 12 is reduced using O2 plasma etching, for example, so as to expose the metal layer 22 provided on the top face of each bump electrode 16. With the present embodiment, Au is exposed as the surface of the metal layer 22. Subsequently, the semiconductor substrate 51 (semiconductor devices 50) and the copper plate 13 are mounted between a pair of flat plates (not shown) which is a component of a press apparatus. The copper plate 13 is mounted such that each bump electrode 16 faces the semiconductor substrate 51 side. In this stage, alignment of the metal layer 22 and the metal layer 60 is performed. The flat plate is formed of SiC, for example. A buffer member is provided for the contact face of the flat plate on the copper plate 13 side. By performing pressure molding using a buffer member, each dummy bump 17 is formed such that it is indented toward the semiconductor substrate 51.

Subsequently, the copper plate 13 and the semiconductor substrate 51 are pressure bonded using the press apparatus. The pressing process is performed at a pressure of approximately 5 Mpa, and at a temperature of approximately 200° C. As shown in FIGS. 5A and 8A, this bonds the copper plate 13 and the semiconductor substrate 51 (semiconductor devices 50) via the insulating resin layer 12 so as to form a single unit. The corresponding metal layer 22 and metal layer 60 are bonded by gold-to-gold bonding, thereby electrically connecting each protruding electrode 16 to the corresponding device electrode 52.

In this stage, in a case in which an insulating material in which plasticity is induced by applying pressure is employed as the insulating resin layer 12, a plastic flow occurs in the insulating resin layer 12 due to the pressure thus applied. Accordingly, each region where the dummy bump 17 is formed on the copper plate 13 is indented toward the semiconductor substrate 51, whereby the top face of each dummy bump 17 is pressed into contact with the surface of the semiconductor substrate 51. In a case in which an insulating material that changes shape when heat is applied is employed as the insulating resin layer 12, the shape of the insulating resin layer 12 changes on the application of heat up to around the glass transition temperature. In this stage, each region where a dummy bump is formed on the copper plate 13 is indented (warps) toward the semiconductor substrate 51, whereby the top face of each dummy bump 17 is pressed into contact with the surface of the semiconductor substrate 51. In the step where the pressure is released or the temperature is reduced to room temperature, the insulating resin layer 12 hardens in the state in which each dummy bump formation region on the copper plate 13 is embedded within the insulating resin layer 12 on the semiconductor substrate 51 side.

By embedding each dummy bump formation region formed on the copper plate 13 within the insulating resin layer 12, the surface where the insulating resin layer 12 is in contact with each dummy bump formation region, or the surface where the insulating resin layer 12 is in contact with the copper plate 13 between each dummy bump 17 and the corresponding bump electrode 16 has a curved cross-section when viewed along the direction in which the wiring layer 14, the insulating resin layer 12, and the semiconductor device 50 are layered. Furthermore, the outer edge portion of the insulating resin layer 12 is in contact with the surface of the semiconductor substrate 51 on the inner side of the dummy bump 17 (on the side where each bump electrode 16 is formed) such that it covers the outer edge portion of the device protection layer 54.

Next, as shown in FIGS. 5B and 8B, the surface of the copper plate 13 opposite to the side where the bump electrodes 16 are provided is etched back by wet etching or the like using an agent such as aqueous ferric chloride or the like, so as to reduce the thickness of the copper plate 13. Thus, the copper plate 13 is formed with a predetermined thickness (thickness of the wiring layer 14).

Next, as shown in FIGS. 5C and 8C, using a photolithography technique, a resist pattern 82 that corresponds to the region where the wiring layer 14 is to be formed is selectively formed on the surface of the copper plate 13 opposite to the insulating resin layer 12.

Next, as shown in FIGS. 6A and 9A, the copper plate 13 is selectively removed to produce a predetermined pattern using an etching technique with the resist pattern 82 as a mask, thereby forming the wiring layer 14. The dummy bumps 17 are removed in the step in which the copper plate 13 is selective removed so as to form the wiring layer 14. After the wiring layer 14 is formed, the resist pattern 82 is removed.

Next, as shown in FIGS. 6B and 9B, after the wiring protection layer 18 is laminated onto the wiring layer and the insulating resin layer 12, the opening 19 is formed in each predetermined region (solder ball mounting region) of the wiring protection layer 18 using the photolithographic method. Thus, the external connection region 14a of the wiring layer 14 is exposed via each opening 19. Furthermore, in the step in which the wiring protection layer 18 is laminated, the region where the dummy bump 17 has been removed is filled with the wiring protection layer 18, thereby forming the protrusion portion 18b. The top face of each protrusion portion 18b is in contact with the surface of the semiconductor substrate 51.

Next, as shown in FIG. 6C, a solder ball 20 is mounted in each opening 19 of the wiring protection layer 18 using the screen printing method. Specifically, a solder paste, which is obtained by mixing resin and a solder material to form a paste, is printed on predetermined regions using a screen mask, and the solder paste thus printed is heated to the solder melting temperature, thereby forming the solder balls 20. Subsequently, dicing is performed for the semiconductor substrate 51 from the back face (lower face side) of the semiconductor substrate 51 along the scribe lines 2 that partition the semiconductor substrate 51 into the multiple semiconductor module formation regions 4, thereby dividing the semiconductor substrate 51 into multiple semiconductor modules 1. Subsequently, residues and so forth, which occur in the dicing step, are removed by performing, using an agent, cleaning processing for the semiconductor modules 1 thus divided.

With such an arrangement, each dummy bump 17 is formed such that the width of the top face thereof is greater than the width of the dicing line. Accordingly, the protrusion portion 18b, which has been formed at a portion where the dummy bump 17 has been removed, also has a top face width which is greater than the width of the dicing line. Accordingly, a part of the protrusion portion 18b remains on the side face (dicing face) of the semiconductor module 1 thus divided. In this state, the side face of each semiconductor module 1 is coated with the wiring protection layer 18. Thus, at the side edge of the semiconductor module 1 in the region where each protrusion portion 18b is formed, the insulating resin layer 12 and the device protection layer 54 are shielded by the wiring protection layer 18, and only the wiring protection layer 18 and the semiconductor substrate 51 are exposed.

Using the steps described above, the semiconductor module 1 is manufactured. In a case in which a semiconductor module 51 (semiconductor device 50) is not mounted, a device mounting substrate 10 is obtained. It should be noted that rough surface formation processing may be performed on each dummy bump 17 so as to form a rough surface structure on the side face of the dummy bump 17. In such an arrangement in which the rough surface structure is formed on the side face of each dummy bump 17, another rough surface structure that corresponds to the aforementioned rough surface structure is formed on the surface of the insulating resin layer 12 which is in contact with the dummy bump 17. As a result, the anchor effect provided by the rough surface structures improves adhesion between the insulating resin layer 12 and the wiring protection layer 18.

Examples of the rough surface formation processing to be performed on the side face of each dummy bump 17 include wet processing using an agent such as CZ processing (trademark), plasma processing, etc. In a case in which rough surface formation processing is performed on each dummy bump 17, first, the bump electrodes 16 and the dummy bumps 17 are formed on the surface of the copper plate 13, following which the surface of the copper plate 13, the surface of each bump electrode 16, and the top face of each dummy bump 17 are coated with a resist film. In a case in which CZ processing is employed, the copper plate 13 is dipped in an agent obtained by mixing formic acid and hydrochloric acid or the like, so as to etch the side face of each dummy bump 17, thereby forming a rough surface structure. On the other hand, in a case in which plasma processing is employed, the copper plate 13 is exposed to a plasma gas atmosphere under predetermined conditions so as to etch the side face of each dummy bump 17, thereby forming a rough surface structure. It should be noted that, in a case in which rolled copper is employed as the copper plate 13, the copper crystal grains that form each dummy bump 17 are arrayed with the longitudinal axis parallel to the top face of the dummy bump 17, and with the short axis approximately perpendicular to the top face of the dummy bump 17. Accordingly, with such an arrangement employing CZ processing, a rough surface structure can be formed on the side face of each dummy bump 17 according to the array of the copper crystal grains without the need to coat the top face of each dummy bump 17 with a resist film. Furthermore, such an arrangement is capable of maintaining an approximately flat surface on the top face of each dummy bump 17.

Figure 10A:
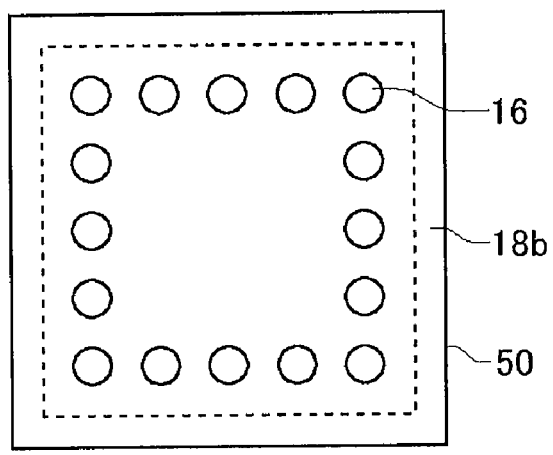
FIG. 10A is a schematic plan view for describing a formation region where protrusion portion is formed according to the embodiment 1.
Figure 10B:
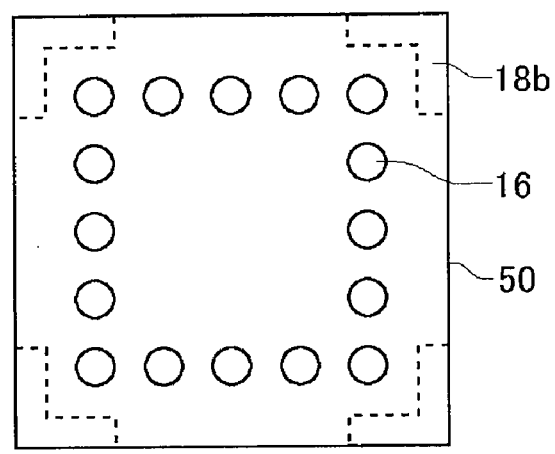
FIG. 10B is a schematic plan view for describing formation regions where protrusion portions are formed according to a modification 1.
Figure 10C:
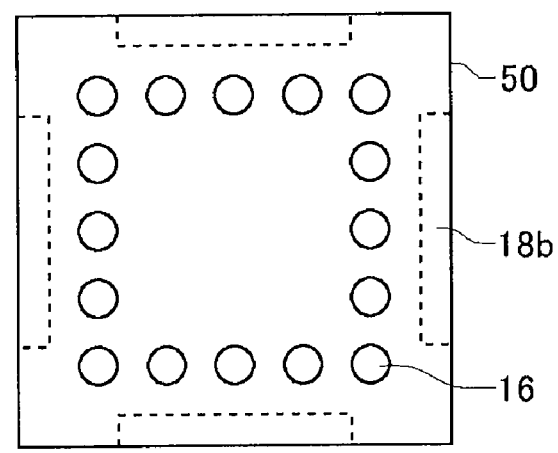
FIG. 10C is a schematic plan view for describing formation regions where protrusion portions are formed according to a modification 2.

Next, detailed description will be made with reference to FIG. 10 regarding the region where the outer edge portion 18*a* of the wiring protection layer 18 is in contact with the outer edge portion 50*a* of the semiconductor device 50, i.e., the formation region where the protrusion portion 18*b* is formed. FIG. 10A is a schematic plan view for describing the formation region in which the protrusion portion is formed in the semiconductor module according to the embodiment 1. FIG. 10B is a schematic plan view for describing the formation region in which the protrusion portion is formed in the semiconductor module according to a modification 1. FIG. 10C is a schematic plan view for describing the formation region in which the protrusion portion is formed in the semiconductor module according to a modification 2.

As shown in FIGS. 10A through 10C, the semiconductor device 50 (semiconductor module 1) has a rectangular shape as seen from a planar view. It should be noted that the shape of the semiconductor device 50 (semiconductor module 1) is not restricted to such an arrangement in particular. Also, the semiconductor device 50 may have a polygonal shape other than such a rectangular shape.

As shown in FIG. 10A, in the semiconductor module 1 according to the present embodiment, the protrusion portion 18*b* is formed along the entire outer edge of the semiconductor module 50 as seen from a planar view. This prevents external moisture from infiltrating into the semiconductor module 1 in a sure manner.

Also, the following modification may be made for the formation region in which the protrusion portion 18*b* is formed. First, as shown in FIG. 10B, in a modification 1, a protrusion portion 18*b* is formed at each corner, as seen from a planar view, of the semiconductor device 50. At each corner of the semiconductor device 50, moisture can infiltrate into the semiconductor device 50 from two sides. Accordingly, there is a high probability of moisture infiltration from each corner. Accordingly, by providing a protrusion portion 18*b* to at least each corner of the semiconductor device 50, such an arrangement effectively prevents external moisture from infiltrating into the semiconductor module 1 while reducing the formation region where the protrusion portion 18*b* is formed. Furthermore, with such an arrangement in which a protrusion portion 18*b* is provided only at each corner, strain that occurs in the semiconductor module 1 due to thermal stress and so forth can be easily released. Thus, such an arrangement improves reliability in the connection between each bump electrode 16 and the corresponding device electrode 52.

Also, as shown in FIG. 10C, a modification 2 has a structure in which, as seen from a planar view, the protrusion portions 18*b* are formed in the regions of the semiconductor device 50 other than the corners thereof. Such an arrangement has the advantage of preventing moisture from infiltrating into the semiconductor module while easily releasing strain that occurs in the semiconductor module 1.

Summarizing the effects and advantages provided by the arrangement described above, the semiconductor module 1 according to the embodiment 1 has a structure in which the outer edge portion 18*a* of the wiring protection layer 18 is in contact with the outer edge portion 50*a* of the semiconductor device 50 such that it shields at least a part of the insulating resin layer 12 at the side edge of the semiconductor module 1. That is to say, the outer edge portion 12*a* of the insulating resin layer 12 and the outer edge portion 54*a* of the device protection layer 54 are coated with the wiring protection layer 18. Accordingly, at each side edge, only the wiring protection layer 18 and the semiconductor device 50 are exposed. As described above, the insulating resin layer 12 and the device protection layer 54 are shielded by the wiring protection layer 18, the hygroscopicity of which is lower than that of the insulating resin layer 12 and the device protection layer 54. Thus, such an arrangement prevents moisture in the atmosphere from infiltrating into the semiconductor module 1. Thus, such an arrangement prevents corrosion of metal members such as the wiring layer 14, the bump electrodes 16, the device electrodes 52, etc., and prevents separation of the members such as the insulating resin layer 12, the wiring layer 14, the wiring protection layer 18, the semiconductor device 50, the device protection layer 54, and so forth. As a result, such an arrangement improves the reliability of the connection between each bump electrode 16 and the corresponding device electrode 52. This improves the reliability of the connection between the device mounting substrate 10 and the semiconductor device 50.

Furthermore, the semiconductor module 1 has a structure in which the outer edge portion 12*a* of the insulating resin layer 12 is in contact with the semiconductor device 50 so as to shield at least a part of the outer edge portion 54*a* of the device protection layer 54 on the inner side of the region where the outer edge portion 18*a* of the wiring protection layer 18 is in contact with the outer edge portion 50*a* of the semiconductor device 50. That is to say, the device protection layer 54 is coated with the insulating resin layer 12 having lower hygroscopicity than that of the device protection layer 54. Accordingly, the insulating resin layer 12 protects the device protection layer 54 from being contact with moisture even if moisture infiltrates through the wiring protection layer 18 or through the interface between the wiring protection layer 18 and the semiconductor device 50. Thus, such an arrangement has the advantage of reducing the risk of corrosion of the metal members and the risk of separation of the members. As a such an arrangement improves reliability in connection between each bump electrode 16 and the corresponding device electrode 52. Thus, such an arrangement improves the reliability in connection between the device mounting substrate 10 and the semiconductor device 50.

Furthermore, the wiring protection layer 18 includes the protrusion portion 18*b* which protrudes toward the semiconductor device 50 side. The surface where the insulating resin layer 12 is in contact with the wiring protection layer 18 at the outer edge portion 12*a* has a curved shape as seen in cross-section. Such an arrangement increases the contact area of the interface between the insulating resin layer 12 and the wiring protection layer 18. This prevents separation of the insulating resin layer 12 and the wiring protection layer 18, thereby improving reliability of the semiconductor module 1. Furthermore, with such an arrangement in which a rough surface structure is provided on a face of the wiring protection layer 18 in the vicinity of the outer edge portion 18*a* that comes in contact with the insulating resin layer 12, e.g., the side face 18*d* of each protrusion portion 18*b*, the anchor effect is provided by the rough surface structure, thereby preventing separation of the insulating resin layer 12 and the wiring protection layer 18. Thus, such an arrangement improves the reliability of the semiconductor module 1.

Furthermore, each dummy bump 17 used to provide the corresponding protrusion portion 18*b* of the wiring protection layer 18 can be formed at the same time as the formation of the bump electrodes 16. Furthermore, bonding of the dummy bumps 17 to the semiconductor module 50 can be performed at the same time as the bonding of each bump electrode 16 to the corresponding device electrode 52. Moreover, the dummy bumps 17 can be removed at the same time as the formation of the wiring layer 14. Thus, the semiconductor module 1 according to the present embodiment can be manufactured without increasing the number of the manufacturing steps.

Embodiment 2

Next, description will be made regarding a mobile device including the semiconductor module 1 according to each embodiment described above. It should be noted that description will be made regarding an arrangement in which the semiconductor module 1 is mounted on a cellular phone which is a mobile device. However, the semiconductor module 1 may be mounted on other electronic devices such as personal digital assistances (PDAs), digital video cameras (DVCs), or digital still cameras (DSCs).

Figure 11:
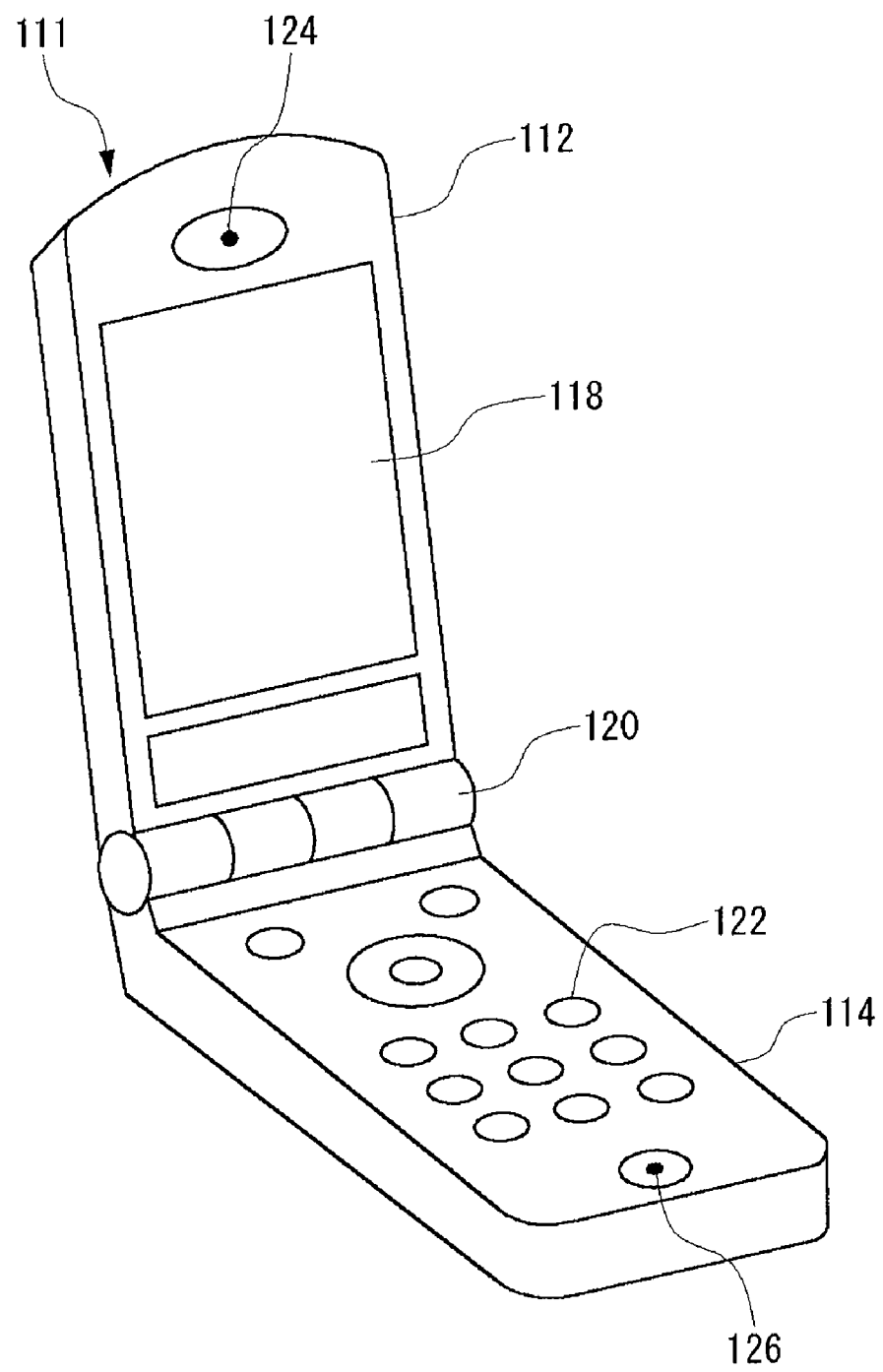
FIG. 11 is a diagram which shows a configuration of a cellular phone according to an embodiment 2.

FIG. 11 is a diagram which shows a configuration of a cellular phone according to an embodiment 2. A cellular phone 111 has a configuration in which a first casing 112 and a second casing 114 are coupled via a movable unit 120. The first casing 112 and the second casing 114 can be rotated along an axis formed by the movable unit 120. The first casing 112 includes a display unit 118 which display information such as text messages, images, etc., and a speaker unit 124. The second casing 114 includes an operating unit 122 such as operating buttons, etc., and a microphone unit 126. The semiconductor module 1 according to the embodiment 1 is mounted within the cellular phone 111 having such a configuration.

Figure 12:
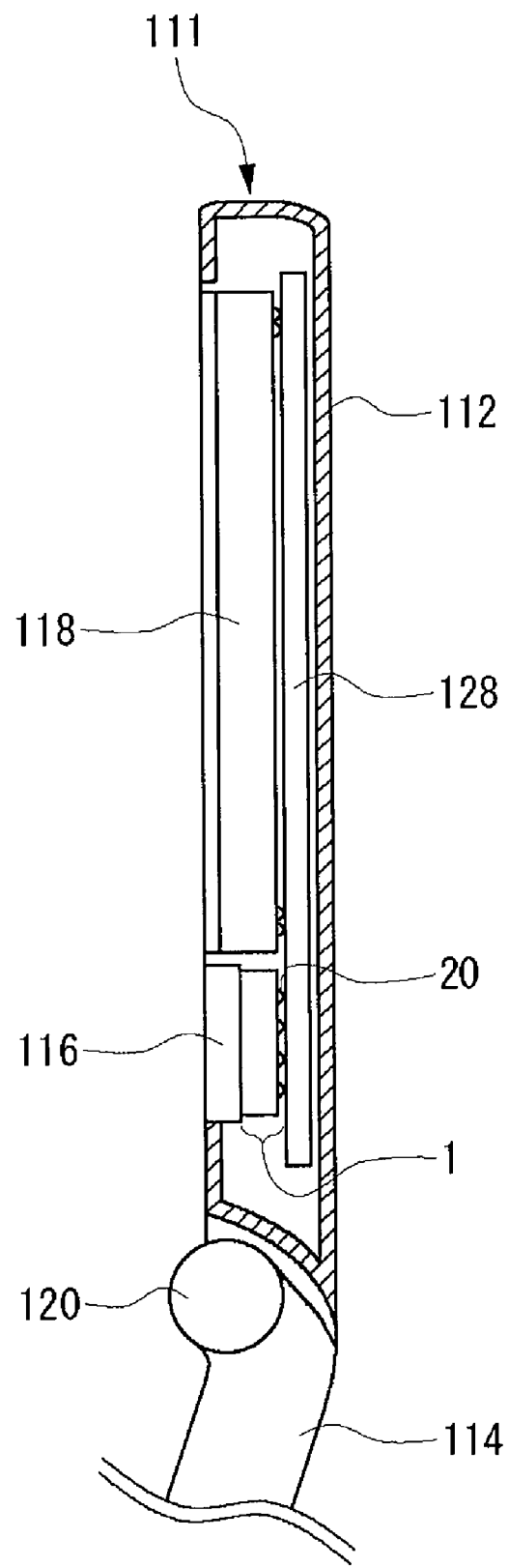
FIG. 12 is a partial cross-sectional diagram which shows the cellular phone shown in FIG. 11.

FIG. 12 is a diagram of a partial cross-section which shows the cellular phone shown in FIG. 11 (cross-sectional diagram showing the first casing 112). The semiconductor module 1 according to the above-described embodiment 1 is mounted on a printed substrate via the solder balls 20, and is electrically connected to the display unit 118 and so forth via such a printed substrate 128. Furthermore, a heat sink substrate 116 such as a metal substrate is provided on the reverse side (the opposite side of the solder balls 20 side) of the semiconductor module 1. For example, such an arrangement prevents heat from being confined in the first casing 112, and effectively disperses heat to the exterior of the first casing 112.

The semiconductor module 1 according to the embodiment 1 improves reliability in connection between each bump electrode 16 and the corresponding device electrode 52. Thus, such a mobile device according to the present embodiment mounting such a semiconductor module 1 provides improved reliability of the operation thereof.

The present invention is not restricted to the above-described embodiments. Also, various modifications may be made with respect to the layout and so forth based upon the knowledge of those skilled in this art. Such modifications of the embodiments are also encompassed by the scope of the present invention.

For example, description has been made above in the embodiment 1 regarding an arrangement including a single wiring layer. Also, the wiring layer having a multi-layered structure may be employed.

What is claimed is:

1. A semiconductor module comprising:
   an insulating resin layer;
   a wiring layer provided on one main surface of the insulating resin layer, and including an external connection region;
   bump electrodes which are electrically connected to the wiring layer, and each of which is formed so as to protrude from the wiring layer toward the insulating resin layer side;
   a semiconductor device which is provided on the other main surface of the insulating resin layer, and which includes device electrodes connected to the bump electrodes; and
   a wiring protection layer provided on the wiring layer and the insulating resin layer such that the external connection region is exposed,
   wherein an outer edge portion of the wiring protection layer is in contact with an outer edge portion of the semiconductor device such that at least a part of the insulating resin layer is shielded at a side edge, and
   a rough surface structure is provided on the face of the wiring protection layer that is in contact with the insulating resin layer in the vicinity of the outer edge portion of the wiring protection layer.

2. A semiconductor module according to claim 1, wherein the semiconductor device comprises a device protection layer arranged such that each of the device electrodes is exposed,
   and wherein an outer edge portion of the insulating resin layer is in contact with the semiconductor device on the inner side of a region where the outer edge portion of the wiring protection layer and the outer edge portion of the semiconductor device are in contact, such that at least a part of the outer edge of the device protection layer is shielded.

3. A semiconductor module according to claim 1, wherein the outer edge portion of the wiring protection layer and the outer edge portion of the semiconductor device are in contact over the entire outer edge of the semiconductor device as seen from a planar view.

4. A semiconductor module according to claim 1, wherein the semiconductor device has a polygonal shape as seen from a planar view,
   and wherein the outer edge portion of the wiring protection layer and the outer edge portion of the semiconductor device are in contact at each corner of the semiconductor device.

5. A semiconductor module according to claim 1, wherein the surface of the outer edge portion of the insulating resin layer that is in contact with the wiring protection layer has a curved shape as seen in cross-section.

* * * * *